United States Patent
Chao et al.

(10) Patent No.: US 7,202,716 B1
(45) Date of Patent: Apr. 10, 2007

(54) APPARATUS AND METHOD OF CONTROLLING AND TUNING A FINE CALIBRATION FOR CLOCK SOURCE SYNCHRONIZATION IN DUAL LOOP OF HYBRID PHASE AND TIME DOMAIN

(75) Inventors: Tze-hsiang Chao, Hsinchu (TW);
Chia-hao Yang, Douliou (TW);
Chia-jung Liu, Banciao (TW)

(73) Assignee: Silicon Integrated Systems Corp., Hsinchu (TW)

( * ) Notice: Subject to any disclaimer, the term of this patent is extended or adjusted under 35 U.S.C. 154(b) by 0 days.

(21) Appl. No.: 11/320,254

(22) Filed: Dec. 27, 2005

Related U.S. Application Data (63) Continuation-in-part of application No. 11/257,258, filed on Oct. 24, 2005, now Pat. No. 7,183,821.

(51) Int. Cl.
*H03L 7/06* (2006.01)
(52) U.S. Cl. ........................ 327/149; 327/158
(58) Field of Classification Search ................ 327/141, 327/147–150, 152–156, 158, 162; 331/17, 331/25, DIG. 2, 177 V; 375/373–376
See application file for complete search history.

(56) References Cited

U.S. PATENT DOCUMENTS 7,119,596 B2 * 10/2006 Kong et al. .................. 327/261

2005/0189974 A1    9/2005 Chao .......................... 327/158

\* cited by examiner

*Primary Examiner*—Linh My Nguyen (57) ABSTRACT

An apparatus and a method of controlling and tuning clock phase alignment with a dual loop of a hybrid phase and time domain for clock source synchronization in electronic devices are described. The coarse calibration unit generates a plurality of output signals, the output signals having a plurality of fixed phase intervals therebetween. At least one of the fixed phase intervals is equal to complete 360 degrees which are divided by the number of the output signals to cover the phase range of complete 360 degrees. The first fine calibration unit connected to the coarse calibration unit delays the output signals generated from the coarse calibration unit by coupling a programmable delay circuit to adjust the phase of a feedback signal toward the phase of a reference signal. The phase detector connected to the first fine calibration unit is used to detect a phase difference between the reference and the feedback signals and outputting an indicating signal corresponding to the phase difference between the reference and the feedback signals. The controller controls the coarse calibration unit and the first fine calibration unit to align the feedback signal to the reference signal according to the indicating signal generated from the phase detector. The rotating detector rapidly tunes the phase difference between the feedback signal and the reference signal by adding a number of time delays to the feedback signal when the feedback signal and the reference signal are miss-aligned.

34 Claims, 9 Drawing Sheets

APPARATUS AND METHOD OF CONTROLLING AND TUNING A FINE CALIBRATION FOR CLOCK SOURCE SYNCHRONIZATION IN DUAL LOOP OF HYBRID PHASE AND TIME DOMAIN

CROSS REFERENCE TO RELATED APPLICATION

This application is a continuation-in-part of prior application Ser. No. 11/257,258, filed Oct. 24, 2005, now U.S. Pat. No. 7,183,821, which application is incorporated by reference.

FIELD OF THE INVENTION

The present invention generally relates to an apparatus and a method of controlling and tuning clock phase alignment, and more particularly, to an apparatus and a method of controlling and tuning clock phase alignment with a dual loop of a hybrid phase and time domain for clock source synchronization in electronic devices.

BACKGROUND OF THE INVENTION

Figure 1:
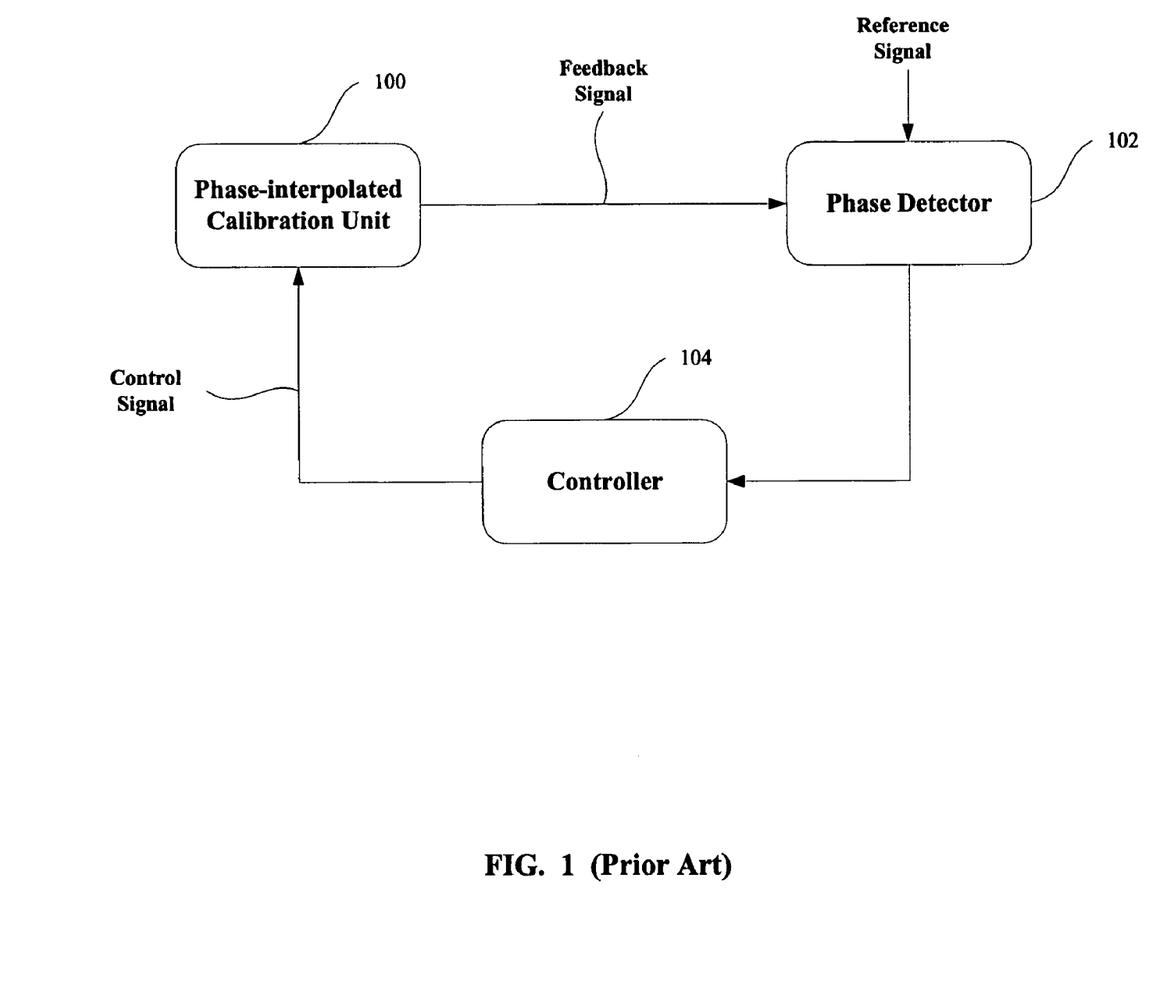
FIG. 1 shows a conventional clock phase alignment in a phase domain for a delay-locked loop.

FIG. 1 shows a conventional block diagram of controlling a clock phase alignment in a delay-locked loop (DLL). The DLL includes a phase-interpolated calibration unit 100, a phase detector 102, and a controller 104. The phase-interpolated calibration unit 100 is capable of receiving an input signal (not shown) and calibrates the phase of the input signal according to a reference signal in a phase domain. The phase detector 102 then detects the phase difference between a feedback signal of the phase-interpolated calibration unit 100 and the reference signal. Thereafter, the controller 104 receives the detecting results of the phase detector 102 and is necessarily required to control the phase-interpolated calibration unit 100 by angular magnitude in the phase domain. The phase-interpolated calibration unit 100 repeatedly adjusts the phase of the feedback signal toward that of the reference signal by interpolating the phase of the feedback signal according to a control signal from the controller 104 until the phase alignment between the feedback signal and the reference signal is achieved.

However, since the phase alignment of the feedback signal and the reference signal is performed in the phase domain by interpolation, the phase-interpolated calibration unit 100 has a large power consumption. The implementation of the phase interpolation utilizes complicated current conversions for the signals when the feedback signal is interpolated to the reference signal. Particularly, while the current signal converted from the signal is quite small, additional circuits are required to solve this situation. Therefore, there is a need to additionally raise the size of the circuit so that the layout of the circuit is more complicated and the cost of the clock source synchronization can be increased.

Moreover, in the prior art, a phase-locked loop (PLL) is usually used in the clock source synchronization. However, the size of the PLL circuit is too large, thereby resulting in noise. Also, the circuit layout of the PLL must be redesigned to improve the stability of the circuit since the manufacturing process of the PLL is changed.

As aforementioned, conventional DLL, which calibrates the clock phase in a phase domain, cannot afford the demand of different synchronization sources. The usage of PLL in synchronization source is also subjected to noise and circuit size. Consequently, there is a need to develop a novel delay-locked loop for the synchronization source to provide the electronic devices with a preferred clock phase adjustment of the feedback and the reference signal for reducing the cost and increasing operation efficiency.

SUMMARY OF THE INVENTION

One object of the present invention is to provide an apparatus and a method of controlling and tuning clock phase alignment with a hybrid phase and time domain for clock source synchronization to coarsely adjust the phase difference between a reference signal and a feedback signal to rapidly select a phase interval in the phase domain for the reference signal by covering the phase range of complete 360 degrees in the phase domain.

Another object of the present invention is to provide an apparatus and a method of controlling and tuning clock phase alignment with a hybrid phase and time domain for clock source synchronization to precisely align the phase of feedback signal to that of the reference signal by a programmable delay circuit in a time domain to save the power consumption of the electronic devices.

Still another object of the present invention is to provide an apparatus and a method of controlling and tuning clock phase alignment with a hybrid phase and time domain for clock source synchronization to implement the controlling apparatus by digital delay-locked loop to avoid the effect of manufacturing process in the electronic devices.

According to the above objects, the present invention sets forth an apparatus and a method of controlling and tuning clock phase alignment with a hybrid phase and time domain for clock source synchronization. The apparatus comprises a coarse calibration unit, a first fine calibration unit, a phase detector, and a controller. The coarse calibration unit generates a plurality of output signals, the output signals having a plurality of fixed phase intervals therebetween. Each of the fixed phase intervals is equal to complete degrees which are divided by the number of the output signals to cover the phase range of complete degrees. The first fine calibration unit connected to the coarse calibration unit delays one of the output signals generated from the coarse calibration unit by coupling a programmable delay circuit to adjust the phase of a feedback signal toward the phase of a reference signal.

The phase detector connected to the first fine calibration unit is used to detect a phase difference between the reference and the feedback signals and outputting an indicating signal corresponding to the phase difference between the reference and the feedback signals. The controller coupled to the coarse calibration unit, the first fine calibration unit, and the phase detector controls the coarse calibration unit and the first fine calibration unit to align the feedback signal to the reference signal according to the indicating signal from the phase detector.

As result, the clock phase alignment between the reference signal and the feedback signal is performed by a dual loop, i.e. a phase and a time domain. In the phase domain of the coarse calibration unit, the phase difference between a reference signal and a feedback signal is coarsely adjusted to rapidly select a phase interval in the phase domain for the reference signal by covering the phase range of complete 360 degrees in the phase domain. In the time domain of the first fine calibration unit, the phase of feedback signal to that of the reference signal is precisely aligned by a programmable delay circuit in a time domain to save the power consumption of the electronic devices. Furthermore, the components of the controlling apparatus are digitally implemented by synthesis design tools to considerably reduce the size of the circuit.

In operation, a plurality of output signals is generated in a coarse calibration unit and each of the output signals has a phase interval therebetween. Each of the phase intervals is equal to complete 360 degrees which are divided by the number of the output signals to cover the phase range of complete 360 degrees in a phase domain. Thereafter, one of the output signals generated in a first fine calibration unit is delayed by coupling a programmable delay circuit in a time domain to adjust a phase of a feedback signal toward a phase of reference signal. Then, the phase difference between the reference and the feedback signal is detected by a phase detector for outputting an indicating signal corresponding to the phase difference between the reference and the feedback signals. Finally, the coarse calibration unit and the fine calibration unit are controlled by the controller to align the feedback signal to the reference signal according to the indicating signal from the phase detector.

Moreover, the apparatus further comprises a rotating detector for rapidly tuning the phase difference between the feedback signal and the reference signal when the feedback signal and the reference signal are miss-aligned. The rotating detector includes a rotating controller, a fine calibration unit and a phase detector. A rotating detection loop is composed of the rotating controller, the fine calibration unit and the phase detector for detecting and correcting the phase difference, if any, between the feedback signal and the reference signal. The rotating detector is capable of compensating the phase difference between the feedback signal and the reference signal by adding an equalized phase value which is equalized with the phase difference of the feedback signal.

The advantages of the present invention include: (a) adjusting the phase difference between a reference signal and a feedback signal to rapidly select a phase interval in the phase domain for the reference signal by covering the phase range in the phase domain; (b) aligning the phase of feedback signal to that of the reference signal by a programmable delay circuit in a time domain to save power consumption; (c) rapidly tuning any phase difference between the feedback signal and the reference signal when the feedback signal and the reference signal are miss-aligned; (d) implementing the controlling apparatus by digital delay-locked loop to avoid the variation effect of manufacturing process in the electronic devices; and (e) reducing the size of the circuit by multiplying frequency in coarse calibration unit.

DETAILED DESCRIPTION OF THE PREFERRED EMBODIMENTS

The present invention is directed to an apparatus and a method of tuning a fine calibration for clock source synchronization in a dual loop of hybrid phase and time domain to coarsely adjust the phase difference between a reference signal and a feedback signal to rapidly select a phase interval in the phase domain for the reference signal by covering the phase range of complete 360 degrees in the phase domain and tuning the feedback signal when it is not aligned with the reference signal. Furthermore, the apparatus precisely aligns the phase of the feedback signal to that of the reference signal by a programmable delay circuit in the time domain to save power consumption of the electronic devices. More importantly, the apparatus tunes the phase of the feedback signal for aligning that of the reference signal by a rotating detector in the phase domain when the feedback signal and the reference signal are not synchronous. It should be noted that the apparatus of the present invention is suitable for clock source synchronization in the electronic devices, such as a north bridge, a south bridge, and a central processing unit (CPU) or the combination, and also for any types of clock synchronization mechanisms.

Figure 2:
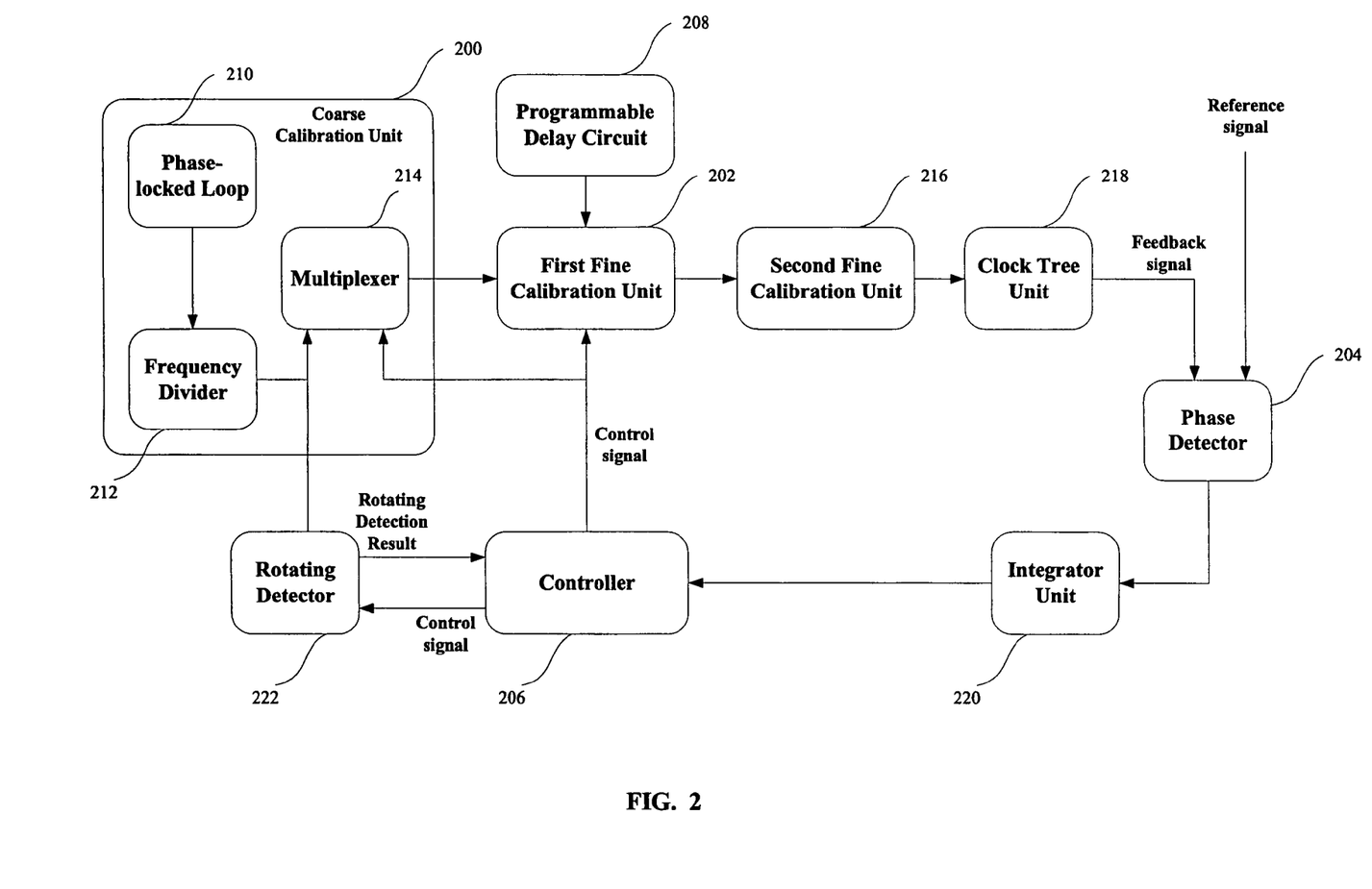
FIG. 2 illustrates a detailed block diagram of an apparatus for controlling clock phase alignment with hybrid phase and time domain according to the present invention.

FIG. 2 illustrates a detailed block diagram of an apparatus for tuning a fine calibration for clock source synchronization in a dual loop of hybrid phase and time domain according to the present invention. The apparatus comprises a coarse calibration unit 200, a first fine calibration unit 202, a phase detector 204, and a controller 206. The coarse calibration unit 200 generates a plurality of output signals, the output signals having a plurality of fixed phase intervals therebetween. Each of the fixed phase intervals is equal to complete 360 degrees which are divided by the number of the output signals to cover the phase range of complete 360 degrees. The first fine calibration unit 202 connected to the coarse calibration unit 200 delays one of the output signals generated from the coarse calibration unit 200 by coupling a programmable delay circuit 208 to adjust the phase of a feedback signal toward the phase of a reference signal.

The phase detector 204 connected to the first fine calibration unit 202 is used to detect a phase difference between the reference and the feedback signals and outputting an indicating signal corresponding to the phase difference between the reference and the feedback signals. The controller 206 coupled to the coarse calibration unit 200, the first fine calibration unit 202, and the phase detector 204 controls the coarse calibration unit 200 and the first fine calibration unit 202 to align the feedback signal to the reference signal according to the indicating signal from the phase detector 204.

Referring to FIG. 2 again, the coarse calibration unit 200 comprises a phase-locked loop 210, a frequency divider 212, and a multiplexer 214. The phase-locked loop 210 generates a plurality of multiplying frequency signals. The frequency divider 212 coupled to the phase-locked loop 210 divides the multiplying frequency signals into the output signals. The multiplexer 214 coupled to the frequency divider 212 and the controller 206 is used to select one of the output signals to be outputted into the first fine calibration unit 202 according to a control signal from the controller 206.

In one embodiment, a second fine calibration unit 216 is connected to the first fine calibration unit 202 and the phase detector 204 for interpolating the signal from the first fine calibration unit 202 to improve the precision of the signals from the first fine calibration unit 202. A clock tree unit 218 coupled to the second fine calibration unit 216 and the phase detector 204 is used to amplify the feedback signal from the second fine calibration unit 216. Preferably, an integrator 220 is located between the phase detector 204 and the controller 206 for integrating the indicating signal from the phase detector 204.

The apparatus according to the present invention further comprises a rotating detector 222 for detecting the phase difference between the feedback signal and the reference signal, and tuning the phase of the feedback signal for aligning the phase of the reference signal when the feedback signal does not align with the reference signal. The detailed structure of the rotating detector 222 will be described later.

Figure 3A:
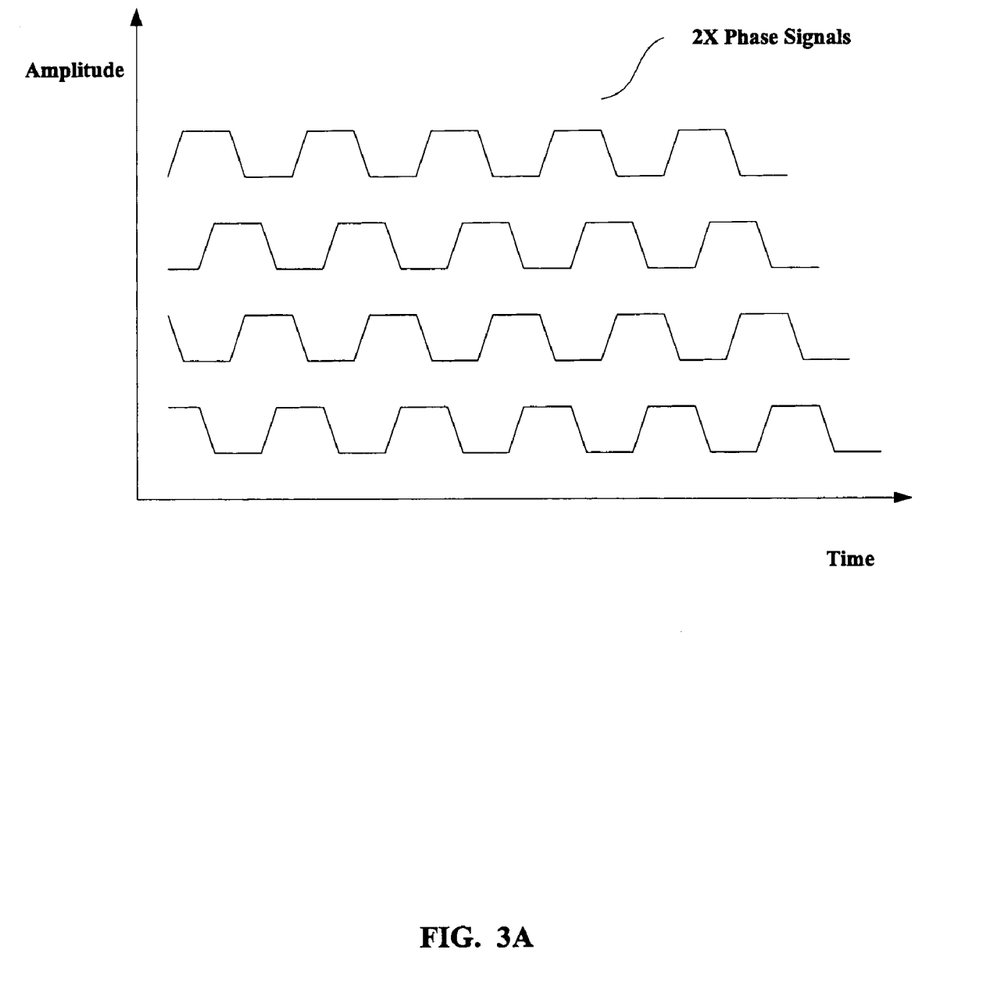
FIGS. 3A and 3B illustrate a timing diagram of multiplying frequency signals of coarse calibration unit in FIG. 2 according to one embodiment of the present invention.
Figure 3B:
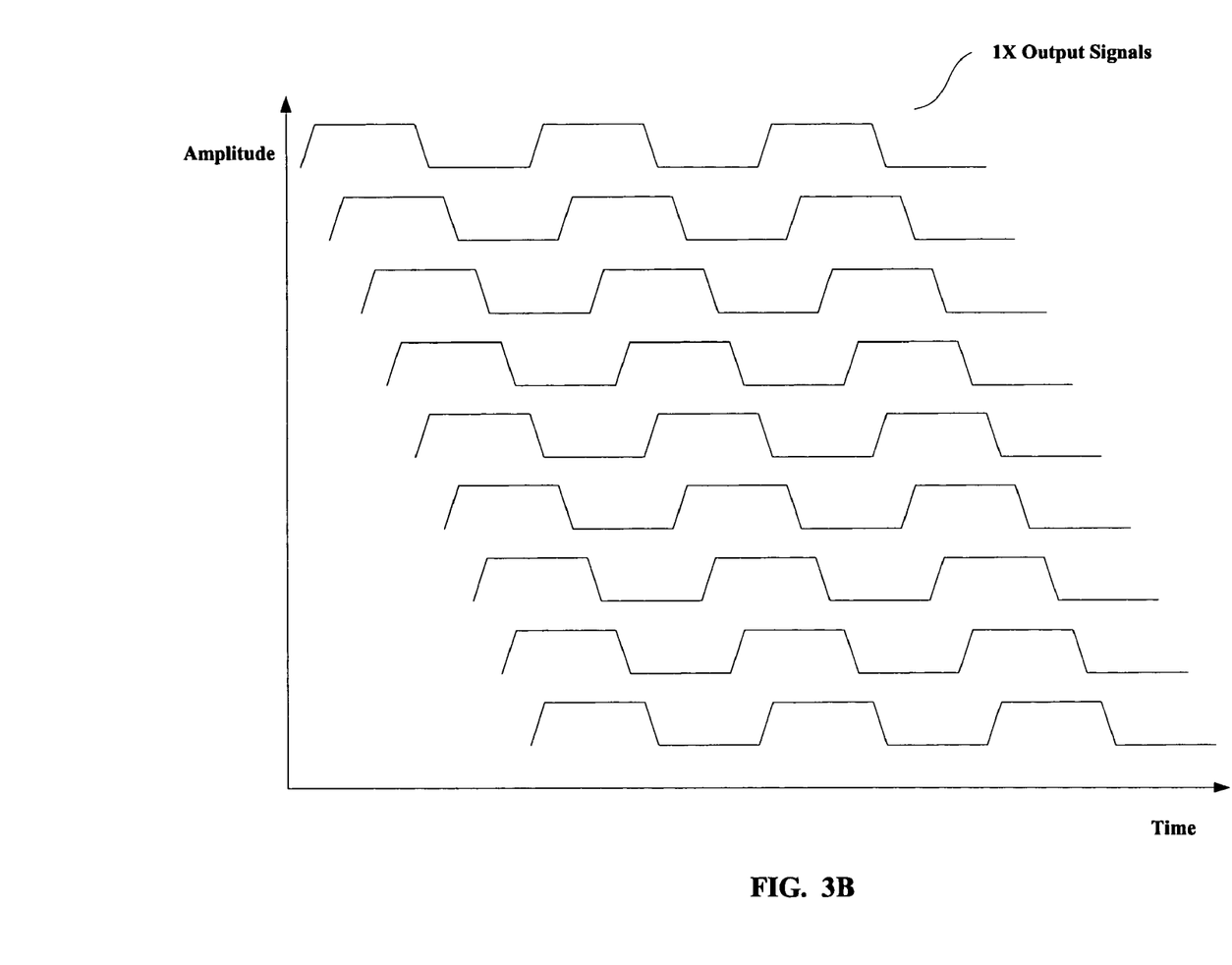

FIGS. 3A and 3B illustrate a timing diagram of multiplying frequency signals of coarse calibration unit in FIG. 2 according to one embodiment of the present invention. In this embodiment, four different phase signals are generated by 2×PLL, as shown in FIG. 3A. Then, in FIG. 3B, the four different phase signals are divided by the frequency divider 212 to generate eight different output signals, e.g. 1× frequency signals in view of the 2×PLL, in a complete 360 degrees so that the reference signal is located in one of the output signals which serve as different feedback signals. Preferably, the 1× frequency signals can be generated by a delay-locked loop generator. Preferably, the delay-locked loop generator can be referred to U.S. application Ser. No. 10/708,373, filed on Feb. 26, 2004 by the same Assignee for further detailed description. Therefore, the phase difference between a reference signal and a feedback signal is coarsely adjusted to rapidly select a phase interval in the phase domain for the reference signal by covering the phase range of complete 360 degrees in the phase domain.

Figure 4A:
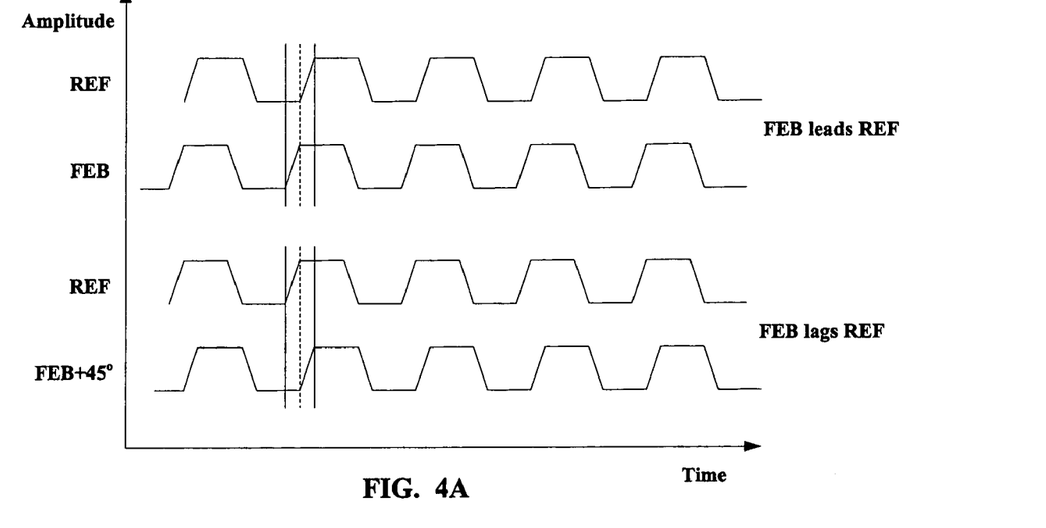
FIGS. 4A and 4B illustrate a timing diagram of a plurality of output signals of the coarse calibration unit in FIG. 2 according to one embodiment of the present invention.
Figure 4B:
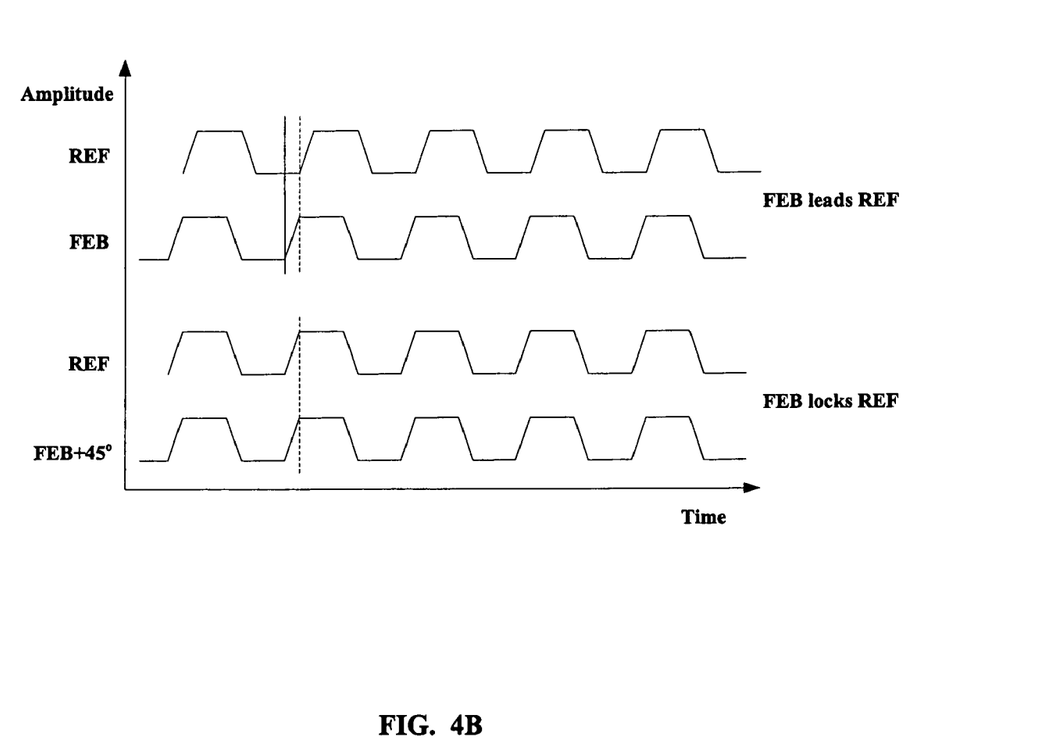

FIGS. 4A and 4B illustrate a timing diagram of a plurality of output signals of the coarse calibration unit in FIG. 2 according to one embodiment of the present invention. The feedback signal is coarsely tuned in the fixed phase intervals which cover the complete 360 degrees and the tuned feedback signal is selected from the fixed phase intervals in the coarse calibration unit to serve as an input signal to the first fine calibration unit 202. The coarse calibration unit 200 is measured by an angular magnitude in the phase domain. In FIG. 4A, one of the output signals from the coarse calibration unit 200 is selected as the feedback signal and then is increased by the phase interval, e.g. 45 degrees, via the controller to repeatedly compare the reference signal with the feedback signals respectively, so that the phase of the reference signal is from a lead status to a lag status with respect to the feedback signal.

In FIG. 4B, one of the output signals from the coarse calibration unit 200 is selected as the feedback signal and then is increased by the phase interval, e.g. 45 degrees, so that the phase of the reference signal is from a lead status to a lock status with respect to the feedback signal. In other words, the reference signal is located between the lead and the lag or the lock output signal. As a result, in the present invention, the controller rapidly identifies the phase interval of the reference signal by coarsely adjusting in the different output signals to select one for transmitting to the first fine calibration unit. In one embodiment, the phase comparison between the reference signal and the feedback signal in the coarse calibration unit 200 is preferably implemented by flip-flop components and delay circuits.

Figure 5A:
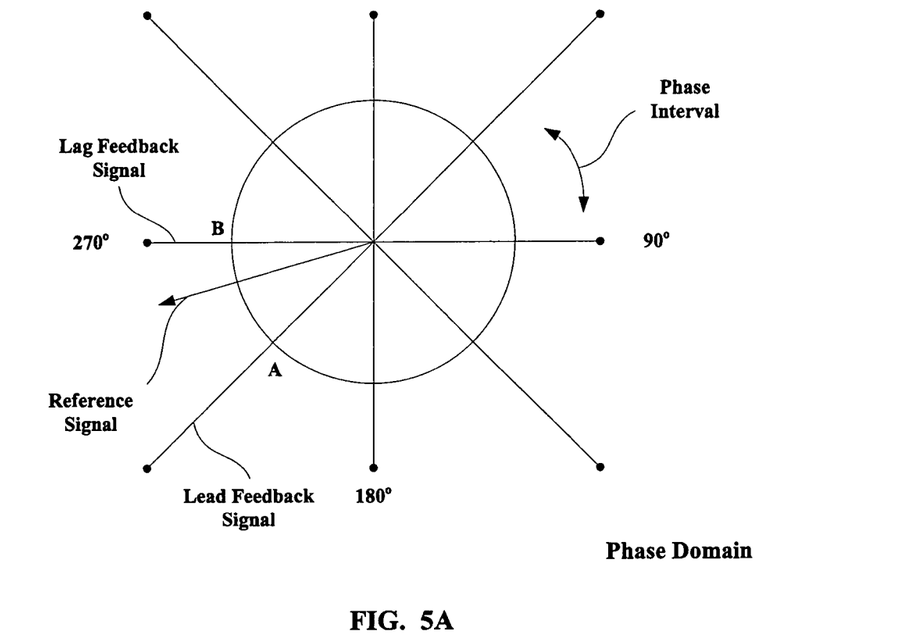
FIG. 5A illustrates the reference and the feedback signals located in the complete 360 degrees represented by a phase domain having a plurality of phase intervals according to the present invention.
Figure 5B:
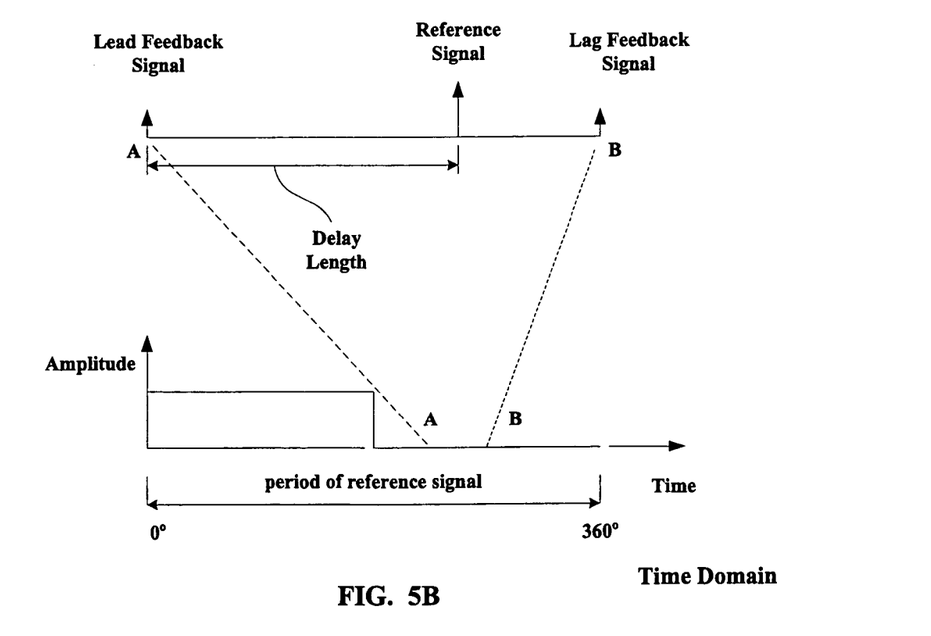
FIG. 5B illustrates the reference and the feedback signals located in a phase interval represented by a time domain in the first fine calibration unit according to the present invention.

FIG. 5A illustrates the reference and the feedback signals located in the complete 360 degrees represented by a phase domain having a plurality of phase intervals according to the present invention. FIG. 5B illustrates the reference and the feedback signals located in a phase interval represented by a time domain in the first fine calibration unit according to the present invention.

In FIG. 5A, the complete 360 degrees with the reference signal is divided into a plurality of phase intervals. In this embodiment, the reference signal is located in one of the phase intervals and the reference signal in the phase domain is measured by an angular magnitude. Thus, the reference signal can always be detected by the controller since the complete 360 degrees is continuous. It should be noted that the range of the phase intervals may be fixed or varied.

In FIG. 5B, the phase interval of the reference signal in FIG. 5B is represented in a time domain. In this embodiment, the reference signal located in the phase interval is measured by a delay length generated by the programmable delay circuit in the time domain. Specifically, the position of the reference signal in the phase domain is mapped to the time domain to precisely adjust the feedback signal toward the reference signal.

As a result, the clock phase alignment between the reference signal and the feedback signal is performed by a dual loop, i.e. a phase domain and a time domain. In the phase domain of the coarse calibration unit, the phase difference between a reference signal and a feedback signal is coarsely adjusted to rapidly select a phase interval in the phase domain for the reference signal by covering the phase range of complete 360 degrees in the phase domain. In the time domain of the first fine calibration unit, the phase of feedback signal to that of the reference signal is precisely aligned by a programmable delay circuit in a time domain to save power consumption of the electronic devices. Furthermore, the components of the apparatus according to the present invention are digitally implemented by synthesis design tools to considerably reduce the size of the circuit.

In one embodiment of the present invention, the delay length of the programmable delay circuit of the first fine calibration unit is at least 1/N times of the period of the reference signal to span at least one phase interval, where N is the number of the output signals. Preferably, the delay length of the first fine calibration unit is at least 1.5/N times of the period of the reference signal to effectively exceed the covered range of one phase interval.

Figure 6:
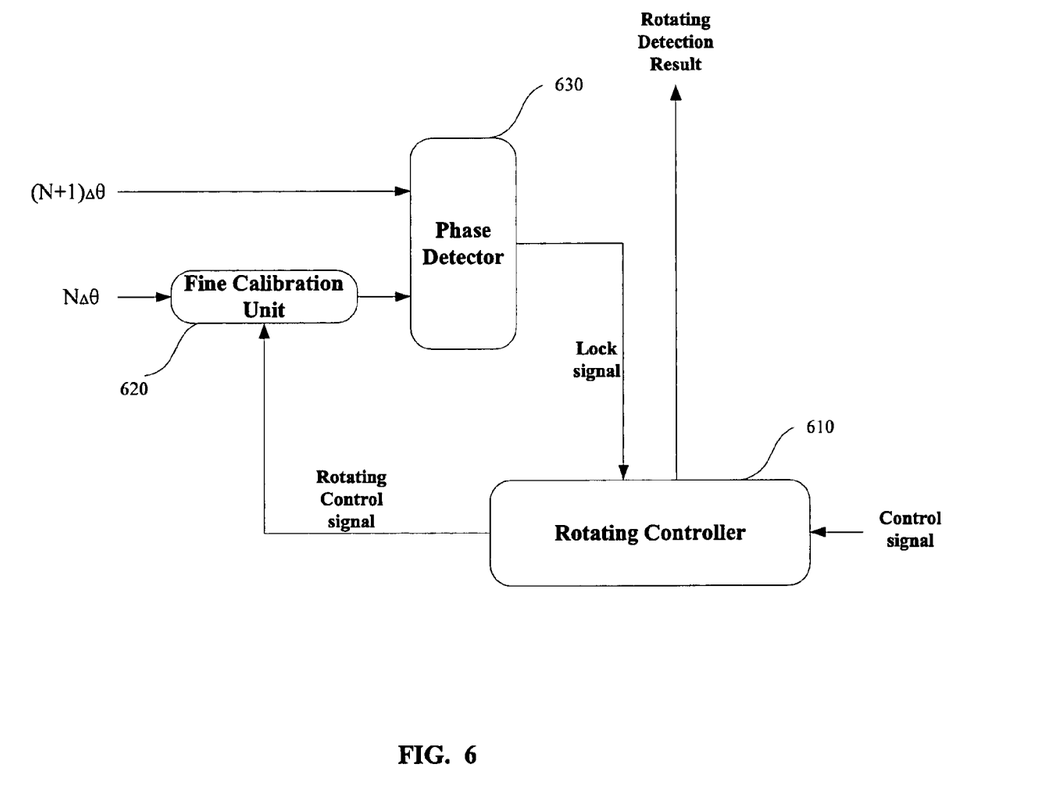
FIG. 6 illustrates a detailed block diagram of the rotating detector in accordance with the present invention.

FIG. 6 shows a detailed block diagram of the rotating detector 222. The rotating detector 222 includes a rotating controller 610, a fine calibration unit 620 and a phase detector 630. A rotating detection loop is composed of the rotating controller 610, the fine calibration unit 620 and the phase detector 630 for detecting and correcting the phase differences, if any, between the feedback signal and the reference signal. The rotating controller 610 receives the control signal from the controller 206 then issues a rotating control signal to the fine calibration unit 620. The fine calibration unit 620 determines the initial number of time delays according to the rotating control signal then transfers the time delays to an equalized phase value for compensating the phase difference between the feedback signal and the reference signal. The equalized phase value is represented by a plurality of unit phase difference, e.g. $N\Delta\theta$. It should be noted that the unit phase difference, i.e. $\Delta\theta$, can be fixed or varied. The fine calibration unit 620 adds the equalized phase value to the feedback signal, and then transmits the tuned feedback signal to the phase detector 630. The phase detector 630 compares the tuned feedback signal with the reference signal for determining whether the tuned feedback signal is aligned with the reference signal. If the tuned feedback signal locks the reference signal, the phase detector 630 will issue a lock signal to rotating controller 610 for reporting the equalized phase value according to the phase difference between the feedback signal and the reference signal. The rotating controller 610 will issue a rotating detection result to the controller 206 after receiving the lock signal which is capable of reporting the equalized phase value complied with the phase difference between the feedback signal and the reference signal. The controller 206 issues a control signal to the first fine calibration unit 202 for adjusting the feedback signal to align with the reference signal. If there is any phase difference between the feedback signal and the reference signal, the rotating detection loop composed of the rotating controller 610, the fine calibration unit 620 and the phase detector 630 will repeatedly detecting and tuning the feedback signal until the feedback signal locks with the reference signal.

Figure 7A:
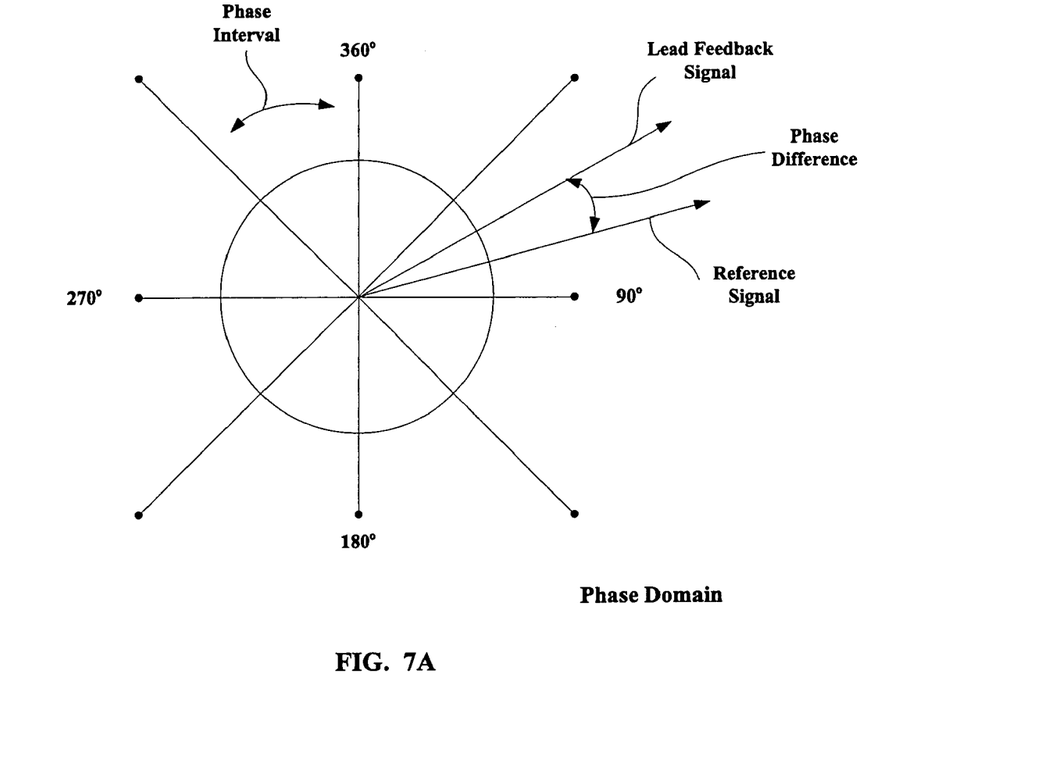
FIG. 7A illustrates a phase domain diagram for exemplifying a phase difference between the reference and the feedback signals located in complete 360 degrees.
Figure 7B:
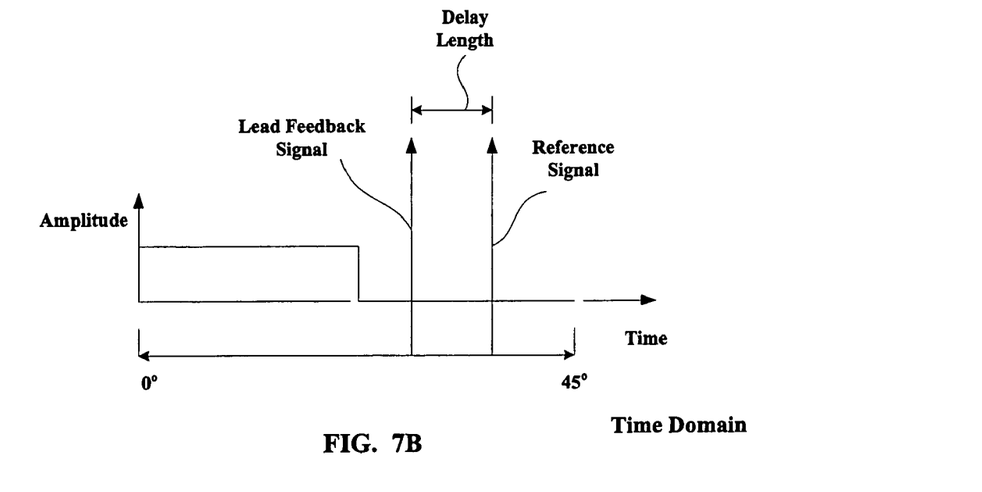
FIG. 7B illustrates a time domain diagram for exemplifying the equalized time delay length between the reference and the feedback signals.

FIG. 7A illustrates a phase domain diagram for exemplifying a phase difference between the reference and the feedback signals located in the complete 360 degrees. FIG. 7B illustrates a time domain diagram for exemplifying the equalized time delay length between the reference and the feedback signals. In FIG. 7A, the feedback signal leads the reference signal by a phase difference so that the rotating detection loop will detect and measure the phase difference for compensating the phase difference by an equalized phase value. The rotating detector 222 will report the rotating detection result when the feedback signal locks to the reference signal. The controller 206 controls the first fine calibration unit 202 for adjusting the feedback signal to align the reference signal according to the rotating detection result. Similarly in FIG. 7B, the feedback signal leads the reference signal by a time delay length which is equalized with the equalized phase value measured by the rotating detector 222. The time delay length between the feedback signal and the reference signal will be corrected by adjusting the feedback signal according to the rotating detection result. It should be noted that the equalized phase value or the time delay length can be a positive value or a minus value based on if the feedback signal leads or lags the reference signal.

Figure 8:
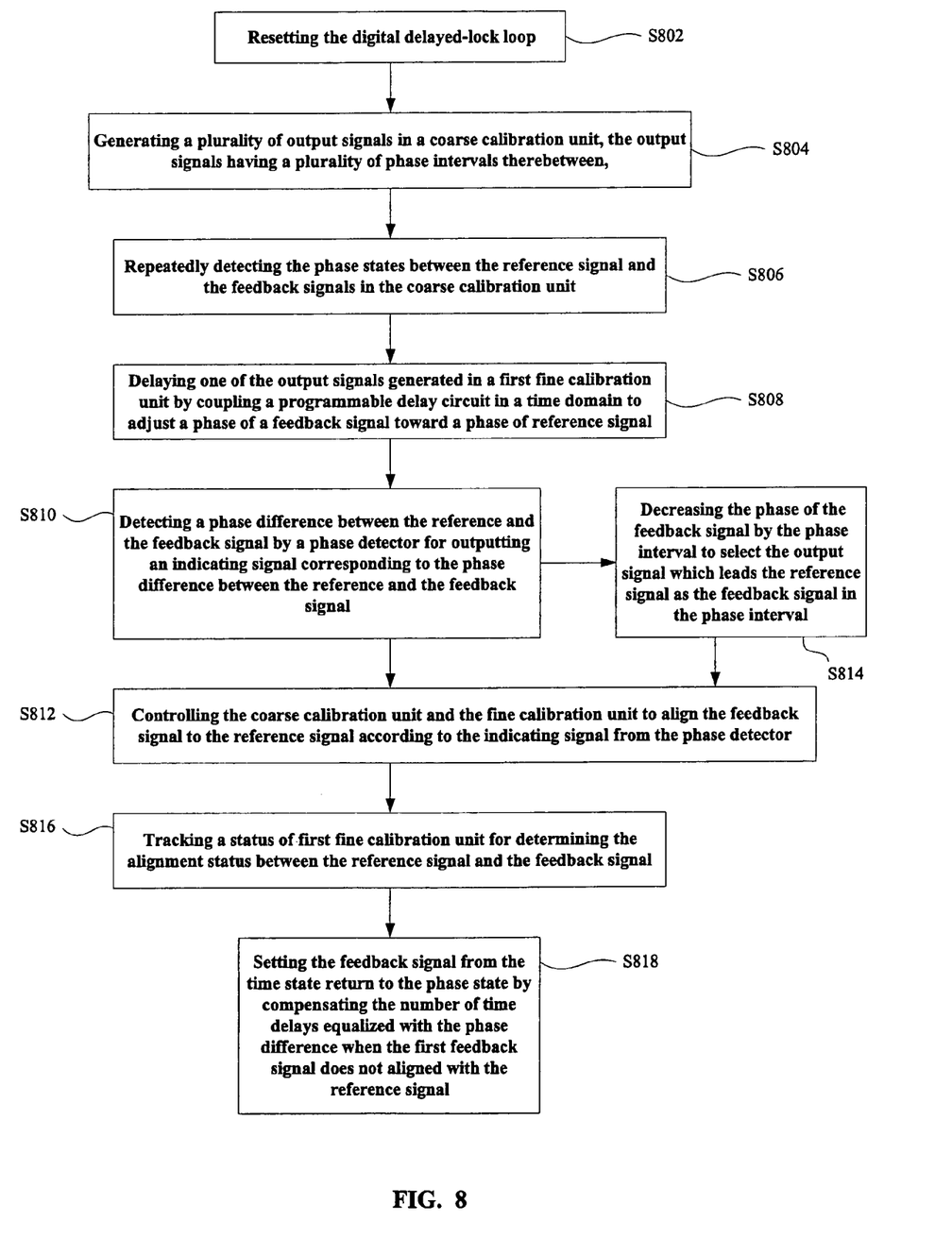
FIG. 8 shows a flow chart of controlling and tuning clock phase alignment with a dual loop, hybrid phase, and time domain according to the present invention.

FIG. 8 shows a flow chart of controlling and tuning the clock phase alignment with a hybrid phase and time domain for clock source synchronization according to the present invention. Starting at step S802, first of all, the digital delayed-lock loop is reset. In step S804, a plurality of output signals is generated in a coarse calibration unit and each of the output signals has a phase interval therebetween, and a reference signal is received by a phase detector. Each of the phase intervals is equal to complete 360 degrees which are divided by the number of the output signals to cover the phase range of complete 360 degrees in a phase domain.

In step S806, the phase detector repeatedly detecting the phase of the reference signal and that of the feedback signal in order to determine whether there is any phase difference between the feedback signal and the reference signal.

After step S806, the phase of the feedback signal is increased ascending from 0 degree or decreased descending from 360 degrees by the phase interval, as shown in FIG. 5A. Then, the controller repeatedly compares the phase of the reference signal with that of the feedback signals, respectively. During the step of increasing the phase of the feedback signal by the phase interval, the comparison results between the reference and the feedback signal from the phase detector are recorded by the controller. When the comparison results between the reference signal and feedback signal are changed from a lead status into a lag or a lock status, the feedback signal is selected from the phase intervals for transmitting the output signal into the first fine calibration unit. Preferably, the phase of the feedback signal is decreased by the phase interval to select the output signal which leads the reference signal as the feedback signal in the phase interval, as shown in step S814.

In step S808, the output signal generated in a first fine calibration unit is delayed by coupling a programmable delay circuit in a time domain to adjust a phase of a feedback signal toward a phase of reference signal. Specifically, during step S808, a delay length generated by the programmable delay circuit is added to the feedback signal when the feedback signal leads the reference signal. Person skilled in the art should know that the delay length can be added in a clockwise or counterclockwise direction. The feedback signal is subtracted by a delay length when the feedback signal lags the reference signal. The delay length keeps constant when the feedback signal locks the reference signal.

In step S810, the phase difference between the reference and the feedback signals is detected by a phase detector for outputting an indicating signal corresponding to the phase difference between the reference and the feedback signals. Finally, in step S812, the coarse calibration unit and the fine calibration unit are controlled by the controller to align the feedback signal to the reference signal according to the indicating signal from the phase detector.

After step S812, a status of first fine calibration unit is tracked by the controller for determining the alignment status between the reference signal and the feedback signal, as shown in step S816. A delay length is added to the feedback signal when the feedback signal leads the reference signal during the track of alignment to reference signal and the feedback signal. A delay length is subtracted from the feedback signal when the feedback signal lags the reference signal. A delay length keeps constant when the feedback signal locks the reference signal.

In step S818, the feedback signal will be transferred from the time state to the phase state by a rotating detector when it is found that the feedback signal can not align with the reference signal because the reference signal is overflowed a boundary of first fine calibration unit. The phase difference between the feedback signal and the reference signal will be compensated by adding a number of time delays equalized with the phase difference.

In one embodiment, an alignment status between the reference signal and the feedback signal is tracked when a delay length of the programmable delay circuit added to the feedback signal is larger than a threshold boundary value. The phase interval is subtracted from the feedback signal in the complete 360 degrees when a delay length of the programmable delay circuit added to the feedback signal is smaller than a threshold boundary value. The feedback signal leads the reference signal after the phase interval is subtracted from the feedback signal.

The advantages of the present invention include: (a) adjusting the phase difference between a reference signal and a feedback signal to rapidly select a phase interval in the phase domain for the reference signal by covering the phase range of complete 360 degrees in the phase domain; (b) aligning the phase of feedback signal to that of the reference signal by a programmable delay circuit in a time domain to save power consumption of the electronic devices; (c) rapidly tuning any phase difference between the feedback signal and the reference signal when the feedback signal is not aligned with the reference signal; (d) implementing the controlling apparatus by digital delay-locked loop to avoid the effect of manufacturing process in the electronic devices; and (e) reducing the size of the circuit by multiplying frequency in coarse calibration unit.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An apparatus of controlling and tuning clock phase alignment, the apparatus comprising:
    a coarse calibration unit, generating a plurality of output signals, the output signals having a plurality of phase intervals therebetween, wherein a predetermined phase angle is divided by the number of the output signals to generate one of the phase intervals;
    a first fine calibration unit connected to the coarse calibration unit, delaying one of the output signals by coupling a programmable delay circuit to adjust a phase of a feedback signal to a phase of a reference signal;
    a phase detector connected to the first fine calibration unit, detecting a phase difference between the reference signal and the feedback signal and outputting an indicating signal corresponding to the phase difference between the reference signal and the feedback signal;
    a controller, controlling the coarse calibration unit and the first fine calibration unit to align the feedback signal to the reference signal according to the indicating signal generated from the phase detector; and
    a rotating detector receiving a control signal from the controller for compensating the feedback signal when the feedback signal and the reference signal are missaligned.

2. The apparatus of claim 1, wherein the coarse calibration unit comprises:
    a phase-locked loop, generating a plurality of multiplying frequency signals;
    a frequency divider coupled to the phase-locked loop, dividing the multiplying frequency signals into the output signals; and
    a multiplexer coupled to the frequency divider and the controller, selecting one of the output signals to be outputted into the first fine calibration unit according to a control signal from the controller.

3. The apparatus of claim 1, wherein the coarse calibration unit is measured by an angular magnitude in a phase domain.

4. The apparatus of claim 1, wherein the feedback signal is coarsely tuned in the fixed phase intervals covering the predetermined phase angle and the tuned feedback signal is selected from the phase intervals in the coarse calibration unit to serve as an input signal to the first fine calibration unit.

5. The apparatus of claim 1, wherein the first fine calibration unit is measured by a delay length generated by the programmable delay circuit in a time domain.

6. The apparatus of claim 5, wherein the delay length of the first fine calibration unit is at least 1/N times of the period of the reference signal and N is the number of the output signals.

7. The apparatus of claim 5, wherein the delay length of the first fine calibration unit is at least 1.5/N times of the period of the reference signal and N is the number of the output signals.

8. The apparatus of claim 5, wherein the delay length of the first fine calibration unit is at least 2/N times of the period of the reference signal and N is the number of the output signals.

9. The apparatus of claim 1, further comprising a second fine calibration unit connected to the first fine calibration unit and the phase detector for interpolating the signal from the first fine calibration unit.

10. The apparatus of claim 1, wherein the rotating detector comprises:
    a rotating controller coupled to the controller, receiving the control signal from the controller then issuing a rotating control signal;
    a third fine calibration unit, determining a number of time delays according to the rotating control signal then transferring the time delays to an equalized phase value for compensating the phase difference between the feedback signal and the reference signal; and
    a phase detector, comparing the feedback signal with the reference signal for determining whether the feedback signal is aligned with the reference signal.

11. The apparatus of claim 1, wherein at least one of the phase intervals is a fixed phase interval.

12. The apparatus of claim 1, wherein at least one of the phase intervals is a variable phase interval.

13. The apparatus of claim 1, wherein the predetermined phase angle is equal to complete 360 degrees.

14. The apparatus of claim 13, wherein the phase intervals between the output signals cover the predetermined phase angle.

15. The apparatus of claim 13, wherein the phase intervals between the output signals cover a portion of the predetermined phase angle.

16. A method of controlling and tuning clock phase alignment, the method comprising the steps of:
    generating a plurality of output signals in a coarse calibration unit, the output signals having a plurality of phase intervals therebetween, wherein a predetermined phase angle is divided by the number of the output signals to generate one of the phase intervals in a phase domain;
    delaying one of the output signals generated in a first fine calibration unit by coupling a programmable delay circuit in a time domain to adjust a phase of a feedback signal to a phase of a reference signal;
    detecting a phase difference between the reference signal and the feedback signal by a phase detector for outputting an indicating signal corresponding to the phase difference between the reference signal and the feedback signal;
    controlling the coarse calibration unit and the first fine calibration unit to align the feedback signal to the reference signal according to the indicating signal from the phase detector using a controller; and
    transferring the feedback signal from the time state to the phase state by a rotating detector when the feedback signal and the reference signal are miss-aligned, then compensating the phase difference between the feedback signal and the reference signal by adding a number of time delays equalized with the phase difference.

17. The method of claim 16, after the step of generating the output signals, further comprising increasing the phase of the feedback signal by the phase interval to repeatedly compare the reference signal with the feedback signals, respectively, using the controller.

18. The method of claim 17, during the step of increasing the phase of the feedback signal by the phase interval, further comprising recording the comparison results between the reference signal and the feedback signal from the phase detector using the controller.

19. The method of claim 18, when the comparison results between the reference signal and feedback signal are changed from a lead status into a lag or a lock status, further comprising selecting the feedback signal from the phase intervals for transmitting the output signal into the first fine calibration unit.

20. The method of claim 19, further comprising decreasing the phase of the feedback signal by the phase interval to select the output signal which leads the reference signal as the feedback signal in the phase interval.

21. The method of claim 16, wherein a delay length is added to the feedback signal when the feedback signal leads the reference signal during the step of delaying the output signal.

22. The method of claim 16, wherein the feedback signal is subtracted by a delay length when the feedback signal lags the reference signal during the step of delaying the output signal.

23. The method of claim 16, wherein a delay length keeps constant when the feedback signal locks the reference signal during the step of delaying the output signal.

24. The method of claim 16, further comprising tracking an alignment status between the reference signal and the feedback signal when a delay length of the programmable delay circuit added to the feedback signal is larger than a threshold boundary value.

25. The method of claim 16, further comprising subtracting the phase interval from the feedback signal in the predetermined phase angle when a delay length of the programmable delay circuit added to the feedback signal is smaller than a threshold boundary value.

26. The method of claim 25, wherein the feedback signal leads the reference signal after subtracting the phase interval from the feedback signal.

27. The method of claim 16, further comprising tracking the alignment to reference signal and the feedback signal after controlling the coarse calibration unit and the first fine calibration unit to align the feedback signal to the reference signal.

28. The method of claim 27, wherein a delay length is added to the feedback signal when the feedback signal leads the reference signal.

29. The method of claim 27, wherein a delay length is subtracted from the feedback signal when the feedback signal lags the reference signal during the step of delaying the output signal.

30. The method of claim 27, wherein a delay length keeps constant when the feedback signal locks the reference signal during the step of delaying the output signal.

31. The method of claim 16, wherein the delay length of the programmable delay circuit is at least 1/N times of the period of the reference signal and N is the number of the output signals.

32. The method of claim 31, wherein the delay length of the programmable delay circuit is at least 1.5/N times of the period of the reference signal.

33. The method of claim 16, wherein the number of time delays equalized with the phase difference is a positive value.

34. The method of claim 16, wherein the number of time delays equalized with the phase difference is a minus value.

* * * * *